(12) United States Patent
Fujiwara

(10) Patent No.: US 10,292,309 B2
(45) Date of Patent: May 14, 2019

(54) HEAT SINK

(71) Applicant: JNC CORPORATION, Tokyo (JP)

(72) Inventor: Takeshi Fujiwara, Ichihara (JP)

(73) Assignee: JNC CORPORATION, Tokyo (JP)

( * ) Notice: Subject to any disclaimer, the term of this patent is extended or adjusted under 35 U.S.C. 154(b) by 536 days.

(21) Appl. No.: 15/035,484

(22) PCT Filed: Nov. 10, 2014

(86) PCT No.: PCT/JP2014/079743
§ 371 (c)(1),
(2) Date: Jul. 21, 2016

(87) PCT Pub. No.: WO2015/072428
PCT Pub. Date: May 21, 2015

(65) Prior Publication Data
US 2016/0324031 A1     Nov. 3, 2016

(30) Foreign Application Priority Data

Nov. 12, 2013 (JP) ................................ 2013-234028

(51) Int. Cl.
*H01L 23/36* (2006.01)
*H01L 23/373* (2006.01)
(Continued)

(52) U.S. Cl.
CPC ........... *H05K 7/2039* (2013.01); *B32B 9/007* (2013.01); *B32B 9/045* (2013.01); *B32B 15/082* (2013.01);
(Continued)

(58) Field of Classification Search
CPC ... H01L 23/367; H01L 23/3672; H01L 23/36; H01L 23/373; H01L 23/42; H01L 23/552;
(Continued)

(56) References Cited

U.S. PATENT DOCUMENTS

2007/0053168 A1* 3/2007 Sayir ...................... B32B 18/00
361/718
2010/0326645 A1* 12/2010 Fan ........................ B82Y 30/00
165/185

FOREIGN PATENT DOCUMENTS

JP  S61-275117   5/1986
JP  H05-048265   2/1993
(Continued)

OTHER PUBLICATIONS

"Office Action of Taiwan Counterpart Application," dated Dec. 11, 2017, with English translation thereof, p. 1-p. 10.
(Continued)

*Primary Examiner* — William K Cheung
(74) *Attorney, Agent, or Firm* — JCIPRNET

(57) ABSTRACT

A heat sink, including a base section in contact with a heating unit, and a heat-dissipating section for dissipating heat received from the heating unit by the base section, in which the base section includes at least one metal layer, and the heat-dissipating section includes a laminate prepared by laminating a metal layer and a graphite layer through an adhesive layer formed by using a composition containing a polyvinyl acetal resin, or a heat sink for dissipating heat from a heating unit, in which the heat sink includes a laminate prepared by laminating a metal layer and a graphite layer through an adhesive layer formed by using a composition containing a polyvinyl acetal resin, and is arranged so as to cover the heating unit.

9 Claims, 5 Drawing Sheets

(51) Int. Cl.
*H01L 23/367* (2006.01)
*B32B 15/082* (2006.01)
*H01L 23/42* (2006.01)
*H01L 23/552* (2006.01)
*H05K 7/20* (2006.01)
*H01L 23/00* (2006.01)
*B32B 9/00* (2006.01)
*B32B 9/04* (2006.01)

(52) U.S. Cl.
CPC ............ *H01L 23/36* (2013.01); *H01L 23/367* (2013.01); *H01L 23/3672* (2013.01); *H01L 23/373* (2013.01); *H01L 24/33* (2013.01); *B32B 2307/302* (2013.01); *B32B 2307/54* (2013.01); *B32B 2457/00* (2013.01); *H01L 23/42* (2013.01); *H01L 23/552* (2013.01); *H01L 2924/0002* (2013.01)

(58) Field of Classification Search
CPC ............ H01L 24/33; H01L 2924/0002; H01L 2924/00; B32B 9/007; B32B 9/045; B32B 15/082; B32B 2307/302; B32B 2307/54; B32B 2457/00; H05K 7/2039
USPC ........................................................ 428/437
See application file for complete search history.

(56) References Cited

FOREIGN PATENT DOCUMENTS

| | | |
|---|---|---|
| JP | H09-155461 | 6/1997 |
| JP | H10-247708 | 9/1998 |
| JP | H11-021117 | 1/1999 |
| JP | 2001-144237 | 5/2001 |
| JP | 2002-329987 | 11/2002 |
| JP | 2004-023066 | 1/2004 |
| JP | 2007-273943 | 10/2007 |
| JP | 2009-099878 | 5/2009 |
| JP | 2009-280433 | 12/2009 |
| JP | 2009-298833 | 12/2009 |
| JP | 2010-202862 | 9/2010 |
| JP | 2010-264495 | 11/2010 |
| JP | 2013-157590 | 8/2013 |
| TW | 201328882 | 7/2013 |

OTHER PUBLICATIONS

"International Search Report (Form PCT/ISA/210) of PCT/JP2014/079743", dated Feb. 3, 2015, with English translation thereof, pp. 1-4.

* cited by examiner

HEAT SINK

CROSS-REFERENCE TO RELATED APPLICATION

This application is a 371 application of the international PCT application serial no. PCT/JP2014/079743, filed on Nov. 10, 2014, which claims the priority benefit of Japan application no. 2013-234028, filed on Nov. 12, 2013. The entirety of each of the above-mentioned patent applications is hereby incorporated by reference herein and made a part of this specification.

TECHNICAL FIELD

The present invention relates to a heat sink for dissipating heat from a heating unit.

BACKGROUND ART

In a heating element to be mounted in electronic equipment including a computer, a heating value has increased in association with achievement of high performance. For example, the heating value is particularly large in a central processing unit (CPU) mounted in the electronic equipment, and therefore a thermal conductor such as a heat sink is generally installed in the CPU. In the thermal conductor, weight increases according to achievement of size increase the like for responding to increase of the heating value in association with achievement of high speed of the CPU. If the weight of the thermal conductor increases, transport of the electronic equipment is liable to become difficult, and simultaneously an excessive load is liable to be applied to the CPU in which the thermal conductor is installed. Moreover, the increase of weight of the thermal conductor to be mounted in an automobile or the like results in deterioration of fuel consumption.

For the above reason, provision of a lightweight thermal conductor without reducing heat-dissipation performance is required, and as one means therefor, study has been conducted on using graphite having thermal conductivity equivalent to or higher than the conductivity of copper or the like, and density lower than the density of copper for a material to be used in the thermal conductor.

Specific examples of a conventional technology on a heat dissipator in which such a kind of graphite is used include an art in Patent literature No. 1.

As described above, the heating value has recently increased in the electronic equipment in association with achievement of high performance and high function, and therefore use of a thermal conductor having superb heat-dissipation characteristics is required in the equipment. An art to the effect of using as such a thermal conductor a laminate prepared by causing adhesion of a graphite sheet and a metal sheet by an adhesive is disclosed (Patent literature Nos. 2 to 5).

The Patent literature No. 3 describes an art to the effect of using a rubber-like elastic adhesive or a silicone-based thermally conductive adhesive as an adhesive, the Patent literature No. 4 describes an art to the effect of using an adhesive in which an electrically conductive filler, such as silver, gold and copper is contained, and the Patent literature No. 5 describes an art to the effect of using an acryl-based adhesive.

Moreover, Patent literature No. 6 describes that achievement of high performance of heat-dissipation performance and weight reduction can be realized by a heat sink configured by forming a laminate of a graphite sheet and a metal thin sheet into a corrugated shape, and connecting the laminate on a heat sink base in a metal thin sheet part.

CITATION LIST

Patent Literature

Patent literature No. 1: JP H11-21117 A
Patent literature No. 2: JP 2001-144237 A
Patent literature No. 3: JP H10-247708 A
Patent literature No. 4: JP 2004-23066 A
Patent literature No. 5: JP 2009-280433 A
Patent literature No. 6: JP 2009-99878 A

SUMMARY OF INVENTION

Technical Problem

The conventional thermal conductors (laminates) described in Patent literature Nos. 2 to 5 have been poor in bond strength between a graphite sheet and a metal sheet in several cases.

Moreover, a layer composed of an adhesive (adhesive layer) ordinarily has a small thermal conductivity, and accordingly as the adhesive layer becomes thicker, thermal resistance in a lamination direction of the laminate becomes larger. A large thermal resistance of the adhesive layer has no change even if an electrically conductive adhesive layer is used, and such an electrically conductive adhesive layer has weak bond strength. Therefore, use of an adhesive layer having excellent bond strength and having thickness as small as possible has been required.

However, the adhesive layers described in Patent literature Nos. 2 to 5 has low bond strength between the graphite sheet and the metal sheet. Therefore, a thermal conductor that can be used in the electronic equipment or the like has been unobtainable unless a thickness of the adhesive layer is increased in several cases. In the laminate having the thick adhesive layer, the weight has increased, and particularly the thermal resistance in the lamination direction of the laminate has been large, and the heat-dissipation characteristics have been poor in several cases. Further, depending on the adhesive layer (for example, the adhesive layer described in Patent literature No. 5) to be used, if a temperature of the laminate is raised by a difference of thermal expansion coefficients between the graphite sheet or the metal layer and the adhesive layer, the laminate has warped in several cases. Use of such a laminate in an electronic circuit or the like has caused a possibility in which the laminate and the electronic circuit are short-circuited, or graphite exposed on a surface by thermal shrinking or a physical shock is gradually peeled into electrically conductive powder to cause short-circuiting of the electronic circuit in several cases.

Moreover, in the heat sink described in Patent literature No. 6, the laminate formed of the graphite sheet and the metal thin plate has low bond strength, and therefore poor mechanical strength and heat-dissipating characteristics, and processing of the laminate into a corrugated shape has been not easy.

The invention is made in view of such a problem, and the invention provides a heat sink that has lightweight and excellent heat-dissipation performance.

Solution to Problem

The present inventors have diligently continued to study in order to solve the problem, and as a result, have found that the problem can be solved by a heat sink including a specific laminate and having specific structure, and have completed the invention.

Item 1. A heat sink, including a base section in contact with a heating unit, and a heat-dissipating section for dissipating heat received from the heating unit by the base section, wherein
the base section includes at least one metal layer, and
the heat-dissipating section includes a laminate prepared by laminating a metal layer and a graphite layer through an adhesive layer formed by using a composition containing a polyvinyl acetal resin.

Item 2. The heat sink according to item 1, wherein the heat-dissipating section is bellows-like.

Item 3. A heat sink for dissipating heat from a heating unit, wherein
the heat sink includes a laminate prepared by laminating a metal layer and a graphite layer through an adhesive layer formed by using a composition containing a polyvinyl acetal resin, and is arranged so as to cover the heating unit.

Item 4. The heat sink according to any one of items 1 to 3, wherein the polyvinyl acetal resin includes the following constitutional units A, B and C:

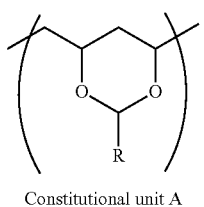

Constitutional unit A

Formula 1

(wherein, in constitutional unit A, R is independently hydrogen or alkyl);

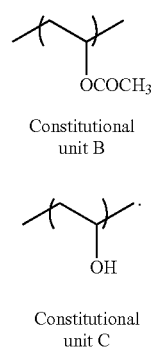

Formula 2

Constitutional unit B

Formula 3

Constitutional unit C

Item 5. The heat sink according to item 4, wherein the polyvinyl acetal resin further includes the following constitutional unit D:

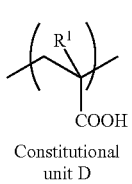

Formula 4

Constitutional unit D (wherein, in constitutional unit D, $R^1$ is independently hydrogen or alkyl having 1 to 5 carbons).

Item 6. The heat sink according to any one of items 1 to 5, wherein a thickness of the adhesive layer is 30 micrometers or less.

Advantageous Effects of Invention

The invention can provide a heat sink having lightweight, a small thickness of an adhesive layer, strong bond strength between a metal layer and a graphite layer and excellent heat-dissipation performance and mechanical strength. Further, the invention can provide a battery, electronic equipment or the like having excellent heat-dissipation performance and a capability of achieving weight reduction.

DESCRIPTION OF EMBODIMENTS

Heat Sink

The invention concerns:

(1) a heat sink (hereinafter, also referred to as "heat sink 1") including a base section in contact with a heating unit and a heat-dissipating section for dissipating heat received from the heating unit by the base section, wherein the base section includes at least one metal layer, and the heat-dissipating section includes a laminate prepared by laminating a metal layer and a graphite layer through adhesive layer (A) formed by using a composition containing a polyvinyl acetal resin; or (2) a heat sink (hereinafter, also referred to as "heat sink 2") for dissipating heat from a heating unit, wherein the heat sink includes a laminate prepared by laminating a metal layer and a graphite layer through adhesive layer (A) formed by using a composition containing a polyvinyl acetal resin, and is arranged so as to cover the heating unit.

In all of the heat sinks, each heat sink includes a specific laminate, and therefore the heat sink having excellent heat-dissipation performance even with lightweight can be obtained. Moreover, the laminate is prepared by laminating the metal layer and the graphite layer through adhesive layer (A), and therefore bond strength between the metal layer and the graphite layer is high, and the heat sink including such a laminate according to the invention is excellent processability and bendability.

Heat Sink 1

The heat sink 1 includes at least the base section in contact with the heating unit, and the heat-dissipating section for dissipating heat received from the heating unit by the base section.

In such heat sink 1, the base section can transfer the heat from the heating unit to the heat-dissipating section, and the heat can be dissipated in the heat-dissipating section.

In addition, "in contact with the heating unit" in the invention means a case where the base section is directly in contact with the heating unit, and also a case where the base section is in contact with the heating unit through conventionally known layer (a) such as an adhesive layer.

Similarly, the base section only needs to be able to transfer the heat from the heating unit to the heat-dissipating section, and therefore the base section may be directly in contact with the heat-dissipating section, or may be in contact with the heat-dissipating section through conventionally known layer (b) such as a pressure-sensitive adhesive layer.

Figure 4:
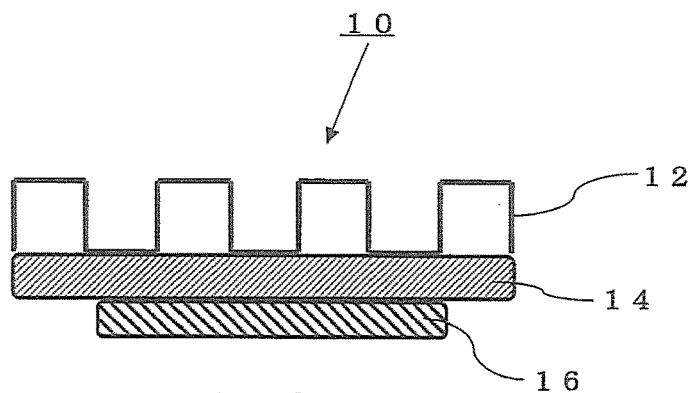
FIG. 4 is a cross-sectional schematic view showing one example of heat sink 1.
Figure 11:
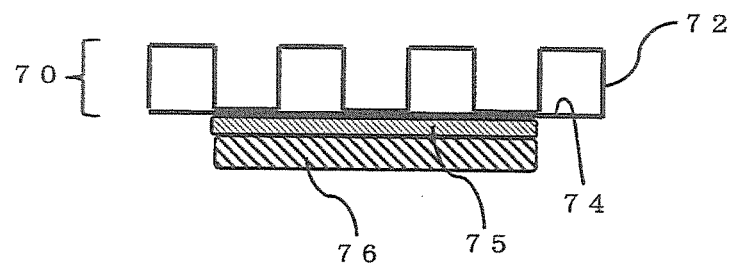
FIG. 11 is a cross-sectional schematic view showing one example of heat sink 1.
Figure 12:
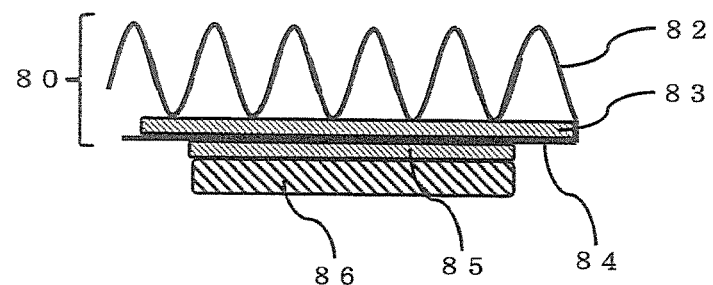
FIG. 12 is a cross-sectional schematic view showing one example of heat sink 1.

More specifically, the heat sink 1 (heat sink 10) may consist of base section 14 in contact with heating unit 16 and heat-dissipating section 12 as shown in FIG. 4, and in the above case, base section 74 and heat-dissipating section 72 may be integrated as shown in FIG. 11. Moreover, the base section and the heat-dissipating section may be connected through conventionally known layer (b) such as the pressure-sensitive adhesive layer, as shown in FIGS. 5 to 12, and in the above case, base section 84 and heat-dissipating section 82 may be integrated as shown in FIG. 12. In FIGS. 5 to 12, 20, 30, 40, 50, 60, 70 and 80 show a heat sink 1,
22, 32, 42, 52, 62 and 82 show a heat-dissipating section,
23, 33, 43, 53, 63 and 83 show a conventionally known layer (b) such as a pressure sensitive adhesive layer,
24, 34, 44, 54 and 64 show a base section,
25, 35, 55, 65, 75 and 85 show a conventionally known layer (a) such as an adhesive layer, and
26, 36, 46, 56, 66, 76 and 86 show a heating unit.

Base Section

The base section is not particularly restricted as long as the base section is in contact with the heating unit, and includes at least one metal layer.

The base section plays a role of transferring the heat from the heating unit to the heat-dissipating section, and also plays a role of prevent contamination caused by powder drop or the like even if the powder drop or the like is caused from the graphite layer or the like used in the heat-dissipating section.

The heat sink 1 has such a base section, and therefore can efficiently transfer the heat from the heating unit to the heat-dissipating section and dissipate the heat even if the heat-dissipating section has a bellows-like shape or the like.

The metal layer included in the base section is not particularly restricted, and may be similar to the metal layer used in the heat-dissipating section. The base section is preferably a member having excellent thermal conductivity. Specific examples of such a metal layer include a layer including gold, silver, copper, aluminum, nickel or magnesium and an alloy containing at least any one of the metals, further preferably a layer including silver, copper, aluminum, nickel or magnesium and an alloy containing at least any one of the metals, and particularly preferably a layer including at least one kind of metal selected from the group of copper, aluminum and magnesium, and an alloy containing at least any one of the metals.

Moreover, in taking into account a balance between the lightweight of the heat sink and the heat-dissipation performance therein, the base section is preferably the laminate prepared by laminating the metal layer and the graphite layer through adhesive layer (A) formed by using the composition containing the polyvinyl acetal resin, and may be the laminate having layer structure identical with the structure of the laminate used in the heat-dissipating section.

When the base section is the laminate having the layer structure identical with the structure in the heat-dissipating section, the heat-dissipating section and the base section may be integrated as shown in FIGS. 11 and 12, and if such structure is formed, the heat sink in which the heat-dissipating section and the base section are integrated can be obtained even without interposing pressure-sensitive adhesive (b) or the like between the heat-dissipating section and the base section, and therefore the heat sink having excellent heat-dissipation performance and so forth is obtained in several cases.

In addition, when such a laminate is used as the base section, a side in contact with the heating unit is preferably the metal layer in view of obtaining the heat sink having excellent heat-dissipation performance and so forth.

A shape of the base section is not particularly restricted as long as the base section is in contact with the heating unit. However, in view of the heat-dissipation performance and so forth of the heat sink, a contact area with a surface of the heating unit is preferably as wide as possible, and the base section having a shape responding to a shape of the surface of the heating unit used in the heat sink is preferably used.

Moreover, a shape on a side opposite to the side in contact with the heating unit of the base section is not particularly restricted, either. However, the base section is directly in contact with the heat-dissipating section or both sections are in contact therewith through pressure-sensitive adhesive layer (b) or the like, and therefore the shape is substantially flat.

A size of the base section is not particularly restricted, either. However, if the heat-dissipation performance of the heat sink is taken into account, as an area of the surface on a side in contact with the heating unit in the base section, the base section preferably has the area identical with or larger than a surface area of the heating unit. In particular, when the heat sink of the invention is used for the heating unit having a small surface area, such a heating unit having a small surface area is hard to dissipate heat, and therefore the heat-dissipation performance of the heat sink can be improved by using the base section having a surface area larger than the surface area of the heating unit and extending the heat in a larger area than the surface area of the heating unit.

A thickness of the base section is not particularly restricted, either. However, the thickness only needs to be appropriately selected in taking into account the heat-dissipation performance of the base section and an application in which the heat sink is used, for example, the size and the weight required for the electronic equipment, and the thickness is ordinarily 0.01 to 30 mm, and preferably 0.03 to 10 mm.

The base section may be directly in contact with the heating unit or may be in contact with the heating unit through conventionally known layer (a) such as the adhesive layer.

The above conventionally known layer (a) such as the adhesive layer is preferably a layer capable of causing adhesion of the heating unit with the base section in such a manner that the heating unit and the base section are integrated, and also a layer capable of efficiently transferring the heat from the heating unit to the base section.

Such layer (a) is not particularly restricted, and specific examples include a layer composed of a pressure-sensitive adhesive, an adhesive, a double-sided adhesive tape, TIM (heat-dissipation sheet), grease, putty, solder, silver paste or the like, and a layer including low-temperature sintered silver nanoparticles or a low-melting point metal. Above all, in view of simplicity of preparing the electronic equipment and lightweight of the electronic equipment to be used or the like, a layer including a pressure-sensitive adhesive, an adhesive, a double-sided adhesive tape, TIM or the like, or a layer including low-temperature sintered silver nanoparticles or a low-melting point metal is preferred.

In addition, when the base section includes the graphite layer and the graphite layer is in contact with the heating unit, a layer formed by using the composition containing the polyvinyl acetal resin in a similar manner described below is preferably used in place of the conventionally known layer (a) in view of adhesion performance, the heat-dissipation performance and so forth.

Moreover, the base section may be arranged so as to be in contact with the heating unit by a method such as lapped flat seam and fastening with a clip.

Heat-Dissipating Section

The heat-dissipating section is not particularly restricted as long as the heat-dissipating section includes the laminate prepared by laminating the metal layer and the graphite layer through adhesive layer (A) formed by using the composition containing the polyvinyl acetal resin.

Each layer composing the laminate will be specifically described in the latter part herein.

The laminate may be a laminate prepared by further laminating, on the graphite layer, a plurality of layers of the metal layers and the graphite layers alternately or the metal layers and/or the graphite layers in arbitrary order through the adhesive layer (A).

When the plurality of the metal layers, the graphite layers or the adhesive layers (A) are used, the layers each may be a similar layer or a different layer, but a similar layer is preferably used. Moreover, a thickness of the layers each may be also similar or different.

The order of lamination only needs to be appropriately selected according to a desired application, and specifically in taking into account desired heat-dissipation characteristics, corrosion resistance and so forth. The number of lamination also only needs to be appropriately selected according to the desired application, and specifically in taking into account the size of the heat sink and the heat-dissipation characteristics therein, and so forth.

Moreover, the laminate may include any layer other than the metal layer, adhesive layer (A) and the graphite layer according to the desired application. For example, a resin layer described below may be provided for the purpose of promoting heat dissipation by radiation from an outermost surface on a side opposite to the side of the laminate in contact with the base section. A thickness of the resin layer in the above case is preferably a thickness at which radiation can be sufficiently made at a degree at which a large thermal resistance value is avoided in view of obtaining satisfactory heat-dissipation characteristics of the heat sink. Further, a conventionally known film is preferably pasted on the outermost surface for the purpose of promoting heat dissipation by radiation from the outermost surface, and further preferably a film in which thermal conductivity is taken into account. As such a film, when the heat sink is used under high temperature conditions, for example, a heat-resistant film made of polyimide or the like is preferred. A thickness of the film only needs to be effective in enhancing emissivity, and therefore is ordinarily selected from 5 to 200 micrometers at which handling is easy, preferably 10 micrometers or more at which radiation performance is satisfactory and handling is easy, and 50 micrometers or less at which the thermal resistance value is small.

Specific examples of any layer other than the metal layer, adhesive layer (A) and the graphite layer include a conventionally known layer having adhesion performance. Specific examples of the laminate having such a layer include a laminate prepared by laminating, on either or both of the metal layer and the graphite layer being the outermost layer, a preformed film made of a resin such as polyethylene terephthalate, polyimide, polyamide and polyvinyl chloride, through a commercially available pressure-sensitive adhesive sheet (layer having adhesion performance) composed of an acryl-based or silicone-based pressure-sensitive adhesive.

The heat-dissipating section preferably has the metal layer on the side in contact with the base section in view of obtaining the heat sink having excellent heat-dissipation performance, and also the metal layer as the outermost layer on the side opposite to the side in contact with the base section in view of obtaining the heat sink having excellent mechanical strength and processability.

Figure 1:
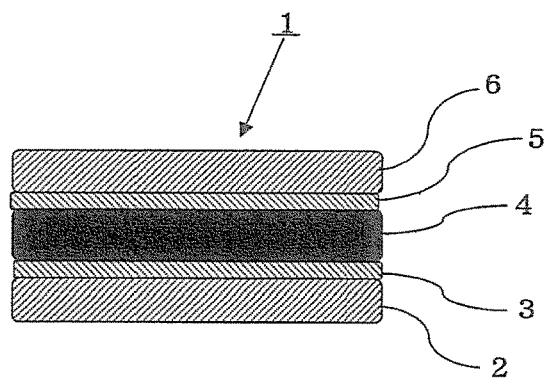
FIG. 1 is a cross-sectional schematic view showing one example of a heat-dissipating section of heat sink 1, and heat sink 2.

More specifically, in view of excellent heat-dissipation characteristics, mechanical strength, lightweight, ease of manufacture and so forth, the heat-dissipating section is preferably a laminate prepared by laminating metal layer 2, adhesive layer (A) 3, graphite layer 4, adhesive layer (A) 5 and metal layer 6 in the order, as shown in FIG. 1.

Figure 2:
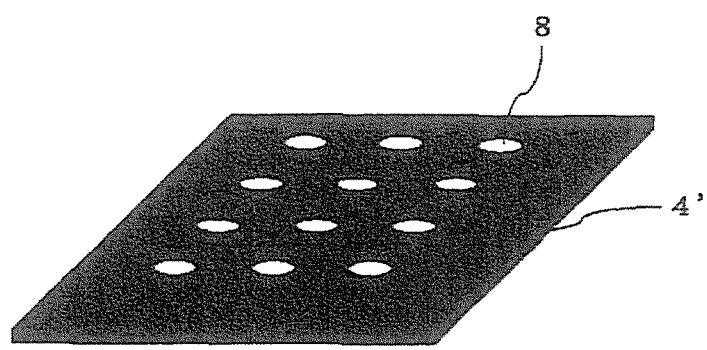
FIG. 2 is a schematic view showing one example of a graphite layer in which holes are provided.
Figure 3:
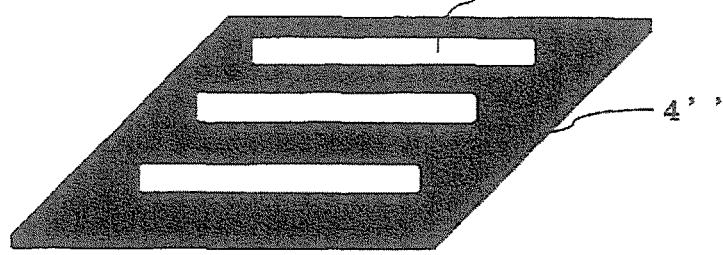
FIG. 3 is a schematic view showing one example of a graphite layer in which slits are provided.

In addition, when a heat sink including laminate 1 as shown in FIG. 1 is manufactured, and particularly when a laminate having high bond strength between metal layers (2 and 6) through graphite layer 4 is desirably manufactured, adhesive layers (A) 3 and 5 may be directly in contact therewith. Specific examples of such an art include a method using graphite layer 4' in which holes 8 are provided, as shown in FIG. 2, and graphite layer 4" in which slits 9 are provided, as shown in FIG. 3.

A shape, the number and a size of the hole or the slit only need to be appropriately selected in view of the mechanical strength and the heat-dissipation characteristics of the heat sink.

When the graphite layer in which the holes or the slits are provided is used, for example, a layer serving as adhesive layer (A) is formed on the metal layer or the graphite layer at a somewhat larger thickness in comparison with the case without the hole or the slit, and temperature during lamination is set at a somewhat higher level. Thus, an adhesive layer-forming component flows into the hole or the slit during heating compression bonding or the like, and the adhesive layer-forming component can be filled into a hole portion or slit portion. Moreover, a layer serving as adhesive layer (A) in a part in contact with the slit or the hole of the graphite layer on the metal layer may be preliminarily formed at a somewhat large thickness by a dispenser or the like.

Moreover, the heat sink having high mechanical strength can be manufactured by using graphite layer 4 having a size (vertical and horizontal lengths of the layer) smaller than the sizes of metal layers 2 and 6 to arrange adhesive layers (A) 3 and 5 in such a manner that adhesive layers (A) 3 and 5 are directly in contact therewith.

A thickness of the laminate composing the heat-dissipating section is not particularly restricted, and only needs to be appropriately selected in taking into account the heat-dissipation performance of the base section and an application in which the heat sink is used, for example, a size and weight required for the electronic equipment, but the thickness is ordinarily 0.01 to 0.5 mm, and preferably 0.02 to 0.2 mm.

In the heat-dissipating section, in order to dissipate the heat from the heating unit, as a shape of the heat-dissipating section, such a shape is preferred as increasing the surface area, for example, a shape in such a manner that an area in which the heat-dissipating section is in contact with open air or the like is increased by forming the shape into a pinholder shape or a bellows-shape. Specific examples of the heat sink having such a shape include heat sinks having shapes as shown in FIGS. 4 to 12. Above all, a bellows-like heat sink, preferably a heat sink in which a direction of laminating the heating unit and the base section and a direction of peaks and troughs composing the bellows of the heat-dissipating section are substantially parallel, specifically the heat sinks having bellows-like heat-dissipating sections as shown in FIGS. 4 to 8, 11 and 12 are preferred in view of a capability of efficiently dissipating the heat in a particularly narrow installation area, and mechanical strength and processability, and the heat sinks have shapes in such a manner that ventilation resistance of air passing through the heat-dissipating section is reduced, and no hindrance is caused for airflow upon dissipating the heat by cooling air, and therefore such shapes are preferred.

In addition, the shapes shown in FIGS. 4 to 12 are provided only as one example, and the shape of the heat-dissipating section can be appropriately changed within the range in which advantageous effects of the invention are not adversely affected. In the heat sink related to each figure, a conventionally known layer (not shown) may be included, and an illustrated conventionally known layer may be non-existent.

Figure 9:
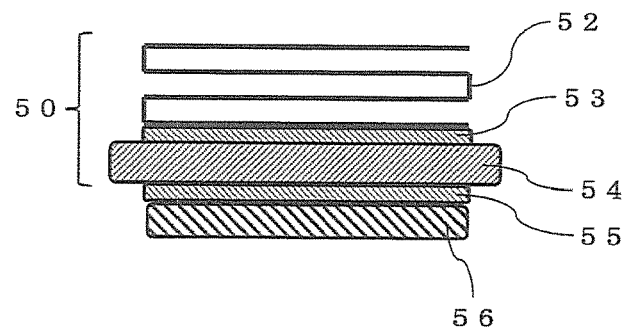
FIG. 9 is a cross-sectional schematic view showing one example of heat sink 1.
Figure 10:
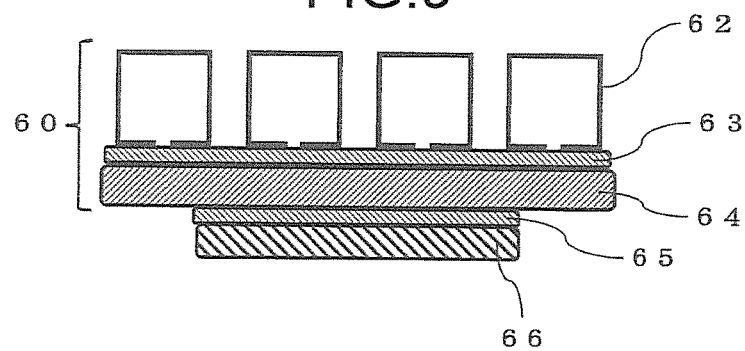
FIG. 10 is a cross-sectional schematic view showing one example of heat sink 1.

In the heat sink related to FIG. 9, a lowermost portion of the heat-dissipating section also directly plays a role of the base section. Therefore, in the case of the heat sink having the shape shown in FIG. 9, conventionally known layer 53 or base section 54 may be non-existent.

The heat-dissipating section is bellows-like, and preferably is in contact with the base section in 1 to 70% of the surface area on the side of the heat-dissipating section in contact with the base section, further preferably 2 to 50% thereof, and still further preferably 5 to 30% thereof. In addition, when conventionally known layer (b) such as the pressure-sensitive adhesive layer exists between the heat-dissipating section and the base section, a proportion of the surface area means the proportion of the area in which the heat-dissipating section is in contact with conventionally known layer (b) such as the pressure-sensitive adhesive layer.

In the heat sink having such a shape, the heat is smoothly transferred from the base section to the heat-dissipating section, and heat dissipation tends to be efficiently performed, and therefore such a case is preferred.

Specific examples of a method of producing such a bellows-like dissipating section include a method including a step of applying heat and/or pressure onto the laminate obtained by the following method to perform three-dimensional processing, and more specifically a method of performing corrugating by using a press type processing machine or a gear type processing machine. In addition, on the above occasion, a processing technique is preferred in which corrugates are processed one peak by one peak for preventing break or the like of each layer composing the laminate. In the above processing technique, such a method is preferred in which a guide for a punch or the like is sequentially descended toward a fixed die provided with a concave groove while sending the laminate, and press processing is applied.

Moreover, the bellows-like dissipating section can also be obtained by previously corrugating the metal layer or the graphite layer composing the laminate, and laminating the corrugated layer through adhesive layer (A) in a manner similar to the method described below.

More specifically, specific examples include the method described in JP 2010-264495 A and JP H9-155461 A.

The graphite layer itself has a brittle structure, and if bending is tried, tends to break on the way. Even such a graphite layer can be bent to some extent by being laminated with the metal layer. However, the graphite layer is still broken in the laminate, resulting in easily causing reduction of the thermal conductivity and mechanical strength of the heat sink to be obtained. Moreover, graphite powder is easily produced by break of the graphite layer, and the heating unit or the like tends to be easily contaminated with the powder.

As described above, three-dimensional processing of the shape in the laminate including the graphite layer has been not easy without deteriorating properties thereof.

Meanwhile, the three-dimensional processing into a desired shape can be achieved by corrugating the laminate including the graphite layer while the guide for the punch or the like is pressed thereon while deterioration of the properties of the laminate is suppressed, and such processing can be made by using the specific laminate.

The heat-dissipating section may be directly in contact with the base section, and may be in contact with the heating unit through conventionally known layer (b) such as the pressure-sensitive adhesive layer.

The conventionally known layer (b) such as the pressure-sensitive adhesive layer is preferably a layer capable of causing adhesion of the base section with the heat-dissipating section in such a manner that the base section and the heat-dissipating section are integrated, and further preferably a layer capable of efficiently transferring the heat from the base section to the heat-dissipating section.

Specific examples of such layer (b) include a layer similar to conventionally known layer (a) such as the adhesive layer.

In addition, when the graphite layer composing the heat-dissipating section is in contact with the base section, a layer formed by using a composition containing a polyvinyl acetal resin similar to the composition described below in place of the conventionally known layer is preferably used in view of the adhesion performance, the heat-dissipation performance and so forth.

The heat-dissipating section may be arranged so as to be in contact with the base section by a method such as the lapped flat seam and fastening with the clip.

Heating Unit

The heating unit with which the heat sink 1 is in contact is not particularly restricted, and specific examples include an electronic device (more specifically an integrated circuit (IC), a resistor and a capacitor), a battery, a liquid crystal display, a light-emitting element (such as an LED element and a laser light-emitting element), a motor, and a sensor.

Heat Sink 2

The heat sink 2 is used for dissipating the heat from the heating unit, and preferably used for dissipating the heat from the heating unit arranged on an electronic circuit board, and has features of including the laminate prepared by laminating the metal layer and the graphite layer through adhesive layer (A) formed by using the composition containing the polyvinyl acetal resin, and being arranged so as to cover the heating unit. Such heat sink 2 can efficiently dissipate the heat from the heating unit, and when a heating unit generating electromagnetic waves is used as the heating unit, heat sink 2 can also further shield the electromagnetic waves.

Specific examples of the laminate used in heat sink 2 include a laminate similar to the laminate exemplified in the heat-dissipating section in heat sink 1. Moreover, the laminate may include any layer other than the metal layer, adhesive layer (A) and the graphite layer, in a manner similar to the laminate exemplified in the heat-dissipating section in heat sink 1.

A thickness of the laminate composing heat sink 2 only needs to be appropriately selected in taking into account the heat-dissipation performance and an application in which the heat sink is used, but the thickness is ordinarily 0.01 to 0.5 mm, and preferably 0.02 to 0.2 mm.

Figure 13:
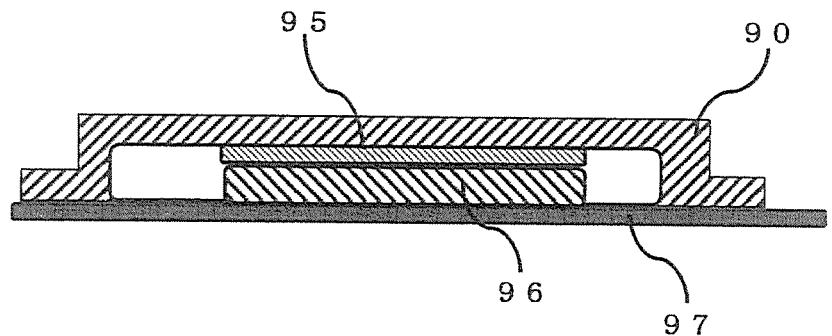
FIG. 13 is a cross-sectional schematic view showing one example of heat sink 2.

A shape of heat sink 2 is not particularly restricted as long as the heat sink is in such a shape as covering the heating unit, and preferably a shape in contact with the electronic circuit board and the heating unit, and as covering the heating unit in view of the heat-dissipation performance, electromagnetic shielding performance, and so forth. Specific examples of such a heat sink 90 include the heat sink shown in FIG. 13. In FIG. 13, 95 is a conventionally known layer (a) such as an adhesive layer, 96 is a heating unit and 97 is an electronic circuit board.

In addition, the heat-dissipation performance can be improved by forming a shape of a plane on a side not in contact with the heating unit in heat sink 2 into a shape by which the surface area increases, for example, the pinholder shape and the bellows shape. However, if the application in which the heat sink is used is taken into account, the shape of the plane on the side not in contact with the heating unit in heat sink 2 is ordinarily substantially flat.

Heat sink 2 is preferably used in contact with the electronic circuit board and the heating unit, and on the above occasion, heat sink 2 may be directly in contact with the electronic circuit board and the heating unit, or may be in contact with the heating unit through conventionally known layer (a) such as the adhesive layer.

The conventionally known layer is preferably a layer capable of causing adhesion of heat sink 2, and the electronic circuit board or the heating unit in such a manner that both are integrated, and further preferably a layer capable of efficiently transferring the heat from the electronic circuit board or the heating unit to the heat-dissipating section.

Specific examples of such a layer include a layer similar to conventionally known layer (a) such as the adhesive layer described in the heat sink 1 above.

In addition, when the graphite layer composing heat sink 2 is in contact with the electronic circuit board or the heating unit, a layer formed by using a composition containing a polyvinyl acetal resin similar to the composition described below in place of the conventionally known layer is preferably used in view of the adhesion performance, the heat-dissipation performance, and so forth.

Moreover, the heat sink 2 may be arranged so as to be in contact with the electronic circuit board or the heating unit by a method such as the lapped flat seam and fastening with the clip. Electrical connection of heat sink 2 with the electronic circuit board can be secured by using an electrically conductive adhesive, a low-melting point solder, a screw or the like, when necessary.

Heating Unit

The heating unit with which heat sink 2 is in contact is not particularly restricted. Specific examples include an integrated circuit (IC), a resistor, and a capacitor.

Electronic Circuit Board

The electronic circuit board is not particularly restricted, and only needs to be a conventionally known printed circuit board or the like. However, if the board is a highly thermally conductive substrate containing a large amount of copper foil component, a higher heat-dissipation effect can be expected.

Laminate

Hereinafter, each layer composing the laminate will be described.

1. Adhesive Layer (A)

The adhesive layer (A) is not particularly restricted as long as the layer is formed by using the composition containing the polyvinyl acetal resin. The composition (hereinafter, also referred to as "composition for adhesive layer formation") may be a composition consisting essentially of the polyvinyl acetal resin, or a composition further containing, in addition to the resin, a thermally conductive filler, an additive and a solvent according to a kind of the metal layer or the like within the range in which the advantageous effects of the invention are not adversely affected.

The heat-dissipating section and the heat sink each having excellent bond strength between the metal layer and the graphite layer, bendability and excellent toughness, flexibility, heat resistance and impact resistance can be obtained by using such adhesive layer (A).

1-1. Polyvinyl Acetal Resin

The polyvinyl acetal resin is not particularly restricted, but preferably is the resin including constitutional units A, B and C described below in view of obtaining adhesive layer (A) having excellent toughness, heat resistance and impact resistance and excellent adhesion with the metal layer or the graphite layer even if the thickness is small.

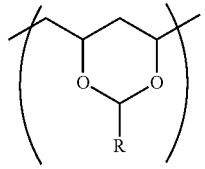

Formula 5

Constitutional unit A

The constitutional unit A is a constitutional unit having an acetal moiety, and may be formed by a reaction between a consecutive polyvinyl alcohol chain unit and aldehyde (R—CHO), for example.

R in constitutional unit A is independently hydrogen or alkyl. If the R is a bulky group (for example, a hydrocarbon group having a large number of carbon), a softening point of the polyvinyl acetal resin tends to decrease. The polyvinyl acetal resin in which the R is the bulky group has high solubility in a solvent, but on the other hand, poor chemical resistance in several cases. Therefore, the R is preferably hydrogen or alkyl having 1 to 5 carbons, preferably hydrogen or alkyl having 1 to 3 carbons, and further preferably hydrogen or propyl in view of toughness of adhesive layer (A) to be obtained and so forth, and particularly preferably hydrogen in view of heat resistance and so forth.

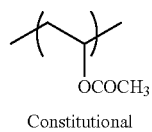

Formula 6

Constitutional unit B

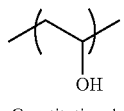

Formula 7

Constitutional unit C

The polyvinyl acetal resin preferably includes constitutional unit D described below, in addition to constitutional units A to C, in view of a capability of obtaining adhesive layer (A) having excellent bond strength with the metal layer or the graphite layer.

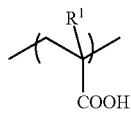

Formula 8

Constitutional unit D

In the constitutional unit D, $R^1$ is independently hydrogen or alkyl having carbons 1 to 5, preferably hydrogen or alkyl having carbons 1 to 3, and further preferably hydrogen.

A total content of constitutional units A, B, C and D in the polyvinyl acetal resin is preferably in the range of approximately 80 to approximately 100 mol % based on the total constitutional units in the resin. Specific examples of any other constitutional unit that may be included in the polyvinyl acetal resin include a vinyl acetal chain unit (constitutional unit in which R in the constitutional unit A is hydrogen or alkyl) other than constitutional unit A, an intermolecular acetal unit described below, and a hemiacetal unit described below. A content of the vinyl acetal chain unit other than constitutional unit A is preferably less than approximately 5 mol % based on the total constitutional units in the polyvinyl acetal resin.

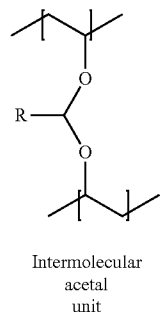

Formula 9

Intermolecular acetal unit wherein, R in the intermolecular acetal unit is defined in a manner identical with R in the constitutional unit A.

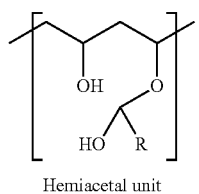

Formula 10

Hemiacetal unit wherein, R in the hemiacetal unit is defined in a manner identical with R in the constitutional unit A.

In the polyvinyl acetal resin, constitutional units A to D may be arranged with regularity (a block copolymer, an alternating copolymer or the like), or in a random manner (a random copolymer), but is preferably arranged in a random manner.

With regard to each constitutional unit in the polyvinyl acetal resin, a content of constitutional unit A is approximately 49.9 to approximately 80 mol %, a content of constitutional unit B is approximately 0.1 to approximately 49.9 mol %, a content of constitutional unit C is approximately 0.1 to approximately 49.9 mol % and a content of constitutional unit D is approximately 0 to approximately 49.9 mol %, based on the total constitutional units in the resin, and the content of constitutional unit A is further preferably approximately 49.9 to approximately 80 mol %, the content of constitutional unit B is further preferably approximately 1 to approximately 30 mol %, the content of constitutional unit C is further preferably approximately 1 to approximately 30 mol % and the content of constitutional unit D is further preferably approximately 0 to approximately 30 mol %, based on the total constitutional units in the resin.

The content of constitutional unit A is preferably approximately 49.9 mol % or more in view of obtaining the polyvinyl acetal resin having excellent chemical resistance, flexibility, abrasion resistance, mechanical strength and so forth.

If the content of constitutional unit B is approximately 0.1 mol % or more, solubility of the polyvinyl acetal resin in the solvent is improved, and therefore such a case is preferred. Moreover, if the content of constitutional unit B is approximately 49.9 mol % or less, the chemical resistance, the flexibility, the abrasion resistance, and the mechanical strength of the polyvinyl acetal resin are hard to be reduced, and therefore such a case is preferred.

The content of constitutional unit C is preferably approximately 49.9 mol % or less in view of solubility of the polyvinyl acetal resin in the solvent or the adhesion performance of adhesive layer (A) to be obtained with the metal layer or the graphite layer, or the like. Moreover, upon acetalizing a polyvinyl alcohol chain in manufacture of the polyvinyl acetal resin, constitutional unit B and constitutional unit C are brought into an equilibrium relationship, and therefore the content of constitutional unit C is preferably approximately 0.1 mol % or more.

In view of a capability of obtaining adhesive layer (A) having excellent bond strength with the metal layer or the graphite layer, the content of constitutional unit D is preferably in the above range.

Each content of constitutional units A to C in the polyvinyl acetal resin can be measured in accordance with JIS K 6728 or JIS K 6729.

The content of constitutional unit D in the polyvinyl acetal resin can be measured by the method described below.

In a 1 mol/L sodium hydroxide aqueous solution, the polyvinyl acetal resin is warmed at 80° C. for 2 hours. Sodium is added to a carboxyl group by the above operation, and a polymer having —COONa is obtained. Excessive sodium hydroxide is extracted from the polymer, and then dehydration drying is performed. Then, the resulting material is carbonized, and atomic absorption spectrometry is conducted, and an addition amount of sodium is determined, and quantitatively determined.

In addition, upon analyzing the content of constitutional unit B (vinyl acetate chain), constitutional unit D is quantitatively determined as the vinyl acetate chain, and therefore the content of constitutional unit B is corrected by subtracting the quantitatively determined content of constitutional unit D from the content of constitutional unit B as measured in accordance with JIS K 6728 or JIS K 6729.

A weight-average molecular weight of the polyvinyl acetal resin is preferably approximately 5,000 to approximately 300,000, and further preferably approximately 10,000 to approximately 150,000. If the polyvinyl acetal resin having the weight-average molecular weight in the above range is used, the heat-dissipating section and the heat sink can be easily manufactured, and the heat-dissipating section and the heat sink each having excellent molding processability or bending strength can be obtained, and therefore such a case is preferred.

The weight-average molecular weight of the polyvinyl acetal resin only needs to be appropriately selected according to a desired purpose. However, in view of a capability of suppressing temperature at a low level upon manufacturing the heat-dissipating section or the heat sink, a capability of obtaining the heat sink having high thermal conductivity, and so forth, the weight-average molecular weight is further preferably approximately 10,000 to approximately 40,000, and still further preferably approximately 50,000 to approximately 150,000 in view of a capability of obtaining the heat sink having high heat-resistant temperature.

In the invention, the weight-average molecular weight of the polyvinyl acetal resin can be measured by gel permeation chromatography (GPC). Specific measurement conditions are as described below.

Detector: 830-RI (made by JASCO Corporation)
Oven: NFL-700M made by Nishio Company
Separation column: Shodex KF-805L×2
Pump: PU-980 (made by JASCO Corporation)
Temperature: 30° C.
Carrier: Tetrahydrofuran
Standard sample: Polystyrene Ostwald viscosity of the polyvinyl acetal resin is preferably approximately 1 to approximately 100 mPa·s. If the polyvinyl acetal resin having the Ostwald viscosity in the above range is used, the heat-dissipating section and the heat sink can be easily manufactured, and the heat-dissipating section and the heat sink each having excellent toughness are obtained, and therefore such a case is preferred.

The Ostwald viscosity can be measured by using a solution in which 5 g of the polyvinyl acetal resin is dissolved in 100 mL of dichloroethane, and at 20° C. by using Ostwald-Cannon Fenske Viscometer.

Specific examples of the polyvinyl acetal resin include polyvinyl butyral, polyvinyl formal, polyvinyl acetoacetal, and a derivative thereof, and preferably polyvinyl formal in view of the adhesion performance with the graphite layer and the heat resistance of adhesive layer (A).

As the polyvinyl acetal resin, the resin may be used alone or in combination of two or more kinds of resins in which a kind of the constitutional unit, a sequence of bonding, the number of bonding and so forth are different.

The polyvinyl acetal resin may be synthesized and obtained or may be a commercially available product.

A method of synthesizing the resin including the constitutional units A, B and C is not particularly restricted, and specific examples include a method described in JP 2009-298833 A. Moreover, a method of synthesizing the resin including the constitutional units A, B, C and D is not particularly restricted, and specific examples include a method described in JP 2010-202862 A.

Specific examples of the commercially available product of the polyvinyl acetal resin include Vinylec C and Vinylec K (made by JNC Corporation) as the polyvinyl formal, and Denka Butyral 3000-K (made by Denka Company Limited) as the polyvinyl butyral 1-2. Thermally Conductive Filler When the adhesive layer (A) contains the thermally conductive filler, the thermal conductivity of adhesive layer (A) is improved, and particularly the thermal conductivity in the lamination direction of the laminate is improved.

Use of adhesive layer (A) containing the thermally conductive filler can provide the heat-dissipating section and the heat sink each having a small thickness of adhesive layer (A), excellent heat-dissipation characteristics and processability, high bond strength between the metal layer and the graphite layer, and excellent processability (bending). Moreover, the use can provide an electronic device in which the heat emitted from the heating unit is sufficiently removed, and weight reduction and a small size can be achieved, and a battery in which a problem or the like caused by heat generation is suppressed even with high energy density.

In the invention, "lamination direction of the laminate" means a longitudinal direction, namely a direction in which metal layer 2, adhesive layer (A) 3 and graphite layer 4 of laminate 1 are laminated in FIG. 1, for example, and specifically, a direction directed from metal layer 2 toward adhesive layer (A) 3 and graphite layer 4, or a direction directed from graphite layer 4 toward adhesive layer (A) 3 and metal layer 2.

The thermally conductive filler is not particularly restricted, and specific examples include a filler containing a metal or a metal compound, such as metal powder, metal oxide powder, metal nitride powder, metal hydroxide powder, metal oxynitride powder and metal carbide powder, and a filler containing a carbon material.

Specific examples of the metal powder include powder composed of a metal such as gold, silver, copper, aluminum and nickel, and an alloy containing the above metal. Specific examples of the metal oxide powder include aluminum oxide powder, zinc oxide powder, magnesium oxide powder, silicon oxide powder, and silicate powder. Specific examples of the metal nitride powder include aluminum nitride powder, boron nitride powder, and silicon nitride powder. Specific examples of the metal hydroxide powder include aluminum hydroxide powder, and magnesium hydroxide powder. Specific examples of the metal oxynitride include aluminum oxynitride powder. Specific examples of the metal carbide powder include silicon carbide powder, and tungsten carbide powder.

Above all, in view of the thermal conductivity, ease of availability, and so forth, aluminum nitride powder, aluminum oxide powder, zinc oxide powder, magnesium oxide powder, silicon carbide powder, and tungsten carbide powder are preferred.

In addition, when the filler containing the metal or the metal compound is used as the thermally conductive filler, a filler containing a metal of a kind similar to the metal composing the metal layer is preferably used.

If the filler containing a metal different from the metal composing the metal layer or the metal compound is used as the thermally conductive filler, a local cell is composed between the metal layer and the filler, and the metal layer or the filler is corroded in several cases.

A shape of the filler containing the metal or the metal compound is not particularly restricted, and specific examples include a particle shape (including a spherical shape and an oval shape), a flat shape, a column shape, a needle-like shape (including a tetrapod-like shape and a dendritic shape), and an indefinite shape. The shapes can be confirmed using a laser diffraction/scattering particle diameter distribution measuring apparatus or a scanning electron microscope (SEM).

As the filler containing the metal or the metal compound, aluminum nitride powder, aluminum oxide powder and zinc oxide powder having a needle shape (particularly, a tetrapod shape) are preferably used.

Zinc oxide has lower thermal conductivity in comparison with aluminum nitride. However, if the tetrapod-shaped zinc oxide powder is used, the heat-dissipating section and the heat sink each having superb heat-dissipation characteristics can be obtained in comparison with a case where the particle-shaped zinc oxide powder is used. Moreover, occurrence of peeling between the metal layer and the graphite layer can be reduced according to an anchor effect by using the tetrapod-shaped zinc-oxide powder.

Moreover, aluminum oxide has lower thermal conductivity, in comparison with aluminum nitride or zinc oxide, but is chemically stable, and reacts with neither water nor acid, or dissolves in neither water nor acid, and therefore the heat-dissipating section and the heat sink each having high weather resistance can be obtained.

If the aluminum nitride powder is used as the filler containing the metal or the metal compound, the heat-dissipating section and the heat sink each having superb heat-dissipation characteristics can be obtained.

A mean diameter of primary particles of the filler containing the metal or the metal compound only needs to be appropriately selected according to a size of the heat-dissipating section or the heat sink, a thickness of adhesive layer (A), or the like, to be desirably formed. However, in view of the thermal conductivity of adhesive layer (A) in the lamination direction of the laminate, the mean diameter is preferably approximately 0.001 to approximately 30 micrometers, and further preferably approximately 0.01 to approximately 20 micrometers. The mean diameter of the filler containing the metal or the metal compound can be confirmed using the laser diffraction/scattering particle diameter distribution measuring apparatus or the scanning electron microscope (SEM).

In addition, the mean diameter of the filler containing the metal or the metal compound means a diameter of particles (length of a major axis in the case of the oval shape) when the filler has a particle shape, a length of the longest side of the flat shape when the filler has the flat shape, a longer value of either a diameter of a circle (a major axis of ellipse) or a length of the column when the filler has the column shape, and a length of the needle when the filler has the needle shape.

Specific examples of the filler containing the carbon material include graphite powder (natural graphite, artificial graphite, expanded graphite, Ketjenblack), carbon nanotubes, diamond powder, carbon fibers, and fulleren, and above all, graphite powder, carbon nanotubes and diamond powder are preferred in view of excellent thermal conductivity, and so forth.

A mean diameter of primary particles of the filler containing the carbon material only needs to be appropriately selected according to a size of the heat-dissipating section or the heat sink, a thickness of adhesive layer (A), or the like, to be desirably formed. However, in view of the thermal conductivity of the adhesive layer (A) in the lamination direction of the laminate, the mean diameter is preferably approximately 0.001 to approximately 20 micrometers, and further preferably approximately 0.02 to approximately 10 micrometers. The mean diameter of the filler composed of the carbon material can be confirmed using the laser diffraction/scattering particle diameter distribution measuring apparatus or the scanning electron microscope (SEM).

In addition, the mean diameter of the carbon nanotubes or the carbon fibers means a length of the tubes or the fibers.

As the thermally conductive filler, a commercially available product in which the mean diameter and the shape are in a desired range may be directly used, or a product obtained by grinding, classifying, or heating the commercially available product in such a manner that the mean diameter and the shape satisfy the desired range may be used.

In addition, the mean diameter or the shape of the thermally conductive filler is varied in a process of manufacturing the heat-dissipating section or the heat sink in several cases. However the filler having the mean diameter or the shape only needs to be compounded into the composition for adhesive layer formation.

As the thermally conductive filler, a commercially available product subjected to surface treatment such as dispersion treatment or water-proof treatment may be directly used, and a product obtained by removing a surface treatment agent from the commercially available product may also be used. Moreover, a commercially available product subjected to no surface treatment may be surface-treated and used.

In particular, aluminum nitride and magnesium oxide are easily deteriorated by moisture in air, and therefore a product subjected to the waterproof treatment is desirably used.

As the thermally conductive filler, the filler described above may be used alone or in combination of two or more kinds.

An amount of compounding the thermally conductive filler is desirably approximately 1 to approximately 80% by volume, further preferably approximately 2 to approximately 40% by volume, and sill further preferably approximately 2 to approximately 30% by volume, based on 100% by volume of adhesive layer (A).

If the thermally conductive filler is contained in adhesive layer (A) in the amount described above, the thermal conductivity of adhesive layer (A) is improved while the adhesion performance is maintained, and therefore such a case is preferred.

If the amount of compounding the thermally conductive filler is in an upper limit or less of the range described above, adhesive layer (A) having high bond strength with the metal layer or the graphite layer is obtained, and if the amount of compounding the thermally conductive filler is in a lower limit or more of the range described above, adhesive layer (A) having high thermal conductivity is obtained, and therefore such a case is preferred.

1-3. Additive

The additive is not particularly restricted as long as the advantageous effects of the invention are not adversely affected, and specific examples include an antioxidant, a silane coupling agent, a thermosetting resin such as an epoxy resin, a curing agent, a copper inhibitor, a metal deactivator, a corrosion inhibitor, a tackifier, an anti-aging agent, a defoaming agent, an antistatic agent, a weather-resistant agent.

For example, when the resin forming adhesive layer (A) is deteriorated by contact with the metal, addition of the copper inhibitor or the metal deactivator described in JP H5-48265 A is preferred. In order to improve adhesion between the thermally conductive filler and the polyvinyl acetal resin, addition of the silane coupling agent is preferred, and in order to improve the heat resistance (glass transition temperature) of adhesive layer (A), addition of the epoxy resin is preferred.

As the silane coupling agent, the silane coupling agents (trade names S330, S510, S520 and S530) made by JNC Corporation and so forth are preferred.

An amount of addition of the silane coupling agent is preferably approximately 1 to approximately 10 parts by weight based on 100 parts by weight in the total amount of the resin included in adhesive layer (A) in view of a capability of improving the adhesion between adhesive layer (A) and the metal layer.

The epoxy resin preferably includes jER828, jER827, jER806, jER807, jER4004P, jER828, jER827, jER806, jER807, jER4004P, jER152 and jER154 made by Mitsubishi Chemical Corporation; Celloxide 2021P and Celloxide 3000 made by Daicel Corporation; YH-434 made by Nippon steel & Sumikin Chemical Co., ltd.; EPPN-201, EOCN-102S, EOCN-103S, EOCN-104S, EOCN-1020, EOCN-1025, EOCN-1027, DPPN-503, DPPN-502H, DPPN-501H, NC6000 and EPPN-202 made by Nippon Kayaku Co., Ltd.; DD-503 made by ADEKA Corporation; Rikaresin W-100 made by New Japan Chemical Co., Ltd.

An amount of addition of the epoxy resin is preferably approximately 1 to approximately 49% by weight based on 100% by weight in the total amount of the resin included in adhesive layer (A) in view of increasing the glass transition temperature of adhesive layer (A), and so forth.

Upon adding the epoxy resin thereto, the curing agent is further preferably added thereto. The curing agent preferably includes an amine-based curing agent, a phenol-based curing agent, a phenol novolak-based curing agent and an imidazole-based curing agent.

The polyvinyl acetal resin composing the adhesive layer (A) has been used for an enameled wire or the like for a long time, and a resin that is hard to deteriorate by contact with the metal or hard to cause deterioration of the metal.

However, when the heat sink is used under a high temperature and high humidity environment, the copper inhibitor or the metal deactivator may be added thereto. The copper inhibitor preferably includes Mark ZS-27 and Mark CDA-16 made by ADEKA Corporation; SANKO-EPOCLEAN made by Sanko Chemical Industry Co., Ltd.; and Irganox MD1024 made by BASF SE.

An amount of addition of the copper inhibitor is preferably approximately 0.1 to approximately 3 parts by weight based on 100 parts by weight in the total amount of the resin included in adhesive layer (A) in view of a capability of preventing deterioration of the resin in a part in contact with the metal in adhesive layer (A).

1-4. Solvent

The solvent is not particularly restricted as long as the solvent can dissolve the polyvinyl acetal resin, but is preferably a solvent capable of dispersing the thermally conductive filler. Specific examples include an alcohol-based solvent such as methanol, ethanol, n-propanol, iso-propanol, n-butanol, sec-butanol, n-octanol and diacetone alcohol and benzyl alcohol; a cellosolve-based solvent such as methyl cellosolve, ethyl cellosolve and butyl cellosolve; a ketone-based solvent such as acetone, methyl ethyl ketone, cyclohexanone, cyclopentanone and isophorone; an amide-based solvent such as N,N-dimethylacetamide, N,N-dimethylformamide and 1-methyl-2-pyrolidone; an ester-based solvent such as methyl acetate and ethyl acetate; an ether-based solvent such as dioxane and tetrahydrofuran; a chlorinated hydrocarbon-based solvent such as dichloromethane and chloroform; an aromatic-based solvent such as toluene and pyridine; dimethyl sulfoxide; acetic acid; terpineol; butyl carbitol; and butyl-carbitol acetate.

The solvent may be used alone or in combination of two or more kinds thereof.

The solvent is preferably used to be preferably approximately 3 to approximately 30% by mass, and further preferably 5 to approximately 20% by mass in a resin concentration in the composition for adhesive layer formation in view of the ease of manufacture, the heat-dissipation characteristics of the heat-dissipating section or the heat sink, and so forth.

1-5. Adhesive Layer (A)

A thickness of the adhesive layer (A) is not particularly restricted, and is preferably as small as possible as long as the adhesive layer (A) has the thickness at which the adhesive layer (A) can cause adhesion of the metal layer with the graphite layer in view of a capability of reducing the thermal resistance and so forth. The thickness is further preferably approximately 30 micrometers or less, still further preferably approximately micrometers or less, and particularly preferably approximately 4 micrometers or less.

In the heat-dissipating section and the heat sink, adhesive layer (A) is formed by using the composition containing the polyvinyl acetal resin, and therefore even if the thickness of the adhesive layer (A) is approximately 1 micrometer or less, the adhesive layer (A) can cause adhesion of the metal layer with the graphite layer.

In addition, the thickness of the adhesive layer (A) means a thickness between the metal layer or the graphite layer in contact with one plane of one layer of adhesive layer (A), and the metal layer or the graphite layer in contact with a plane opposite to the plane of the adhesive layer (A), the plane with which the metal layer or the graphite layer is in contact. However, even in the case where the graphite layer is used as shown in FIG. 2 or 3, the thickness of adhesive layer (A) means the thickness between the metal layers and/or the graphite layers, and does not include thickness of adhesive layer (A) that may be filled into the hole and the slit.

Moreover, the thermally conductive filler that may be included in the adhesive layer (A) is stuck into the graphite layer in several cases. However, even in such a case, the thickness of adhesive layer (A) means the thickness between the metal layers and/or the graphite layers without considering a filler part stuck into the graphite layer.

2. Metal Layer

The metal layer is laminated for improvement in heat capacity, mechanical strength, processability and so forth of the heat sink.

The metal layer includes preferably a layer including a metal having excellent thermal conductivity, further preferably a layer including gold, silver, copper, aluminum, nickel and an alloy containing at least one kind thereof, still further preferably a layer including silver, copper, aluminum, nickel and an alloy containing at least one kind thereof, and particularly preferably a layer including at least one selected from the group of copper, aluminum and an alloy containing at least one kind thereof.

The alloy may be in any state of a solid solution, a eutectic alloy or an intermetallic compound.

Specific examples of the alloy include phosphor bronze, copper nickel and duralumin.

A thickness of the metal layer is not particularly restricted, and only needs to be appropriately selected in taking into account an application, the weight, the thermal conductivity and so forth of the heat sink to be obtained. However, the thickness is preferably approximately 0.01 to 100 times the thickness of the graphite layer, and further preferably approximately 0.1 to approximately 10 times the thickness thereof. If the thickness of the metal layer is in the range described above, the heat-dissipating section and the heat sink each having excellent heat-dissipation characteristics and mechanical strength can be obtained.

3. Graphite Layer

The graphite layer has large thermal conductivity, and is lightweight and enriched in flexibility. The heat-dissipating section and the heat sink each having excellent heat-dissipation characteristics and lightweight can be obtained by using such a graphite layer.

The graphite layer is not particularly restricted as long as the graphite layer is a layer composed of graphite. For example, the graphite layer manufactured by a method described in JP S61-275117 A and JP H11-21117 A may be used, or a commercially available product may also be used.

Specific examples of the commercially available product include, as an artificial graphite sheet manufactured of a synthetic resin sheet, eGRAF SPREADERSHIELD SS-1500 (made by GrafTECH International Holding Inc.), Graphinity (made by Kaneka Corporation), and PGS graphite sheet (made by Panasonic Corporation), and include, as a natural graphite sheet manufactured of natural graphite, eGRAF SPREADERSHIELD SS-500 (made by GrafTECH International Holding Inc.).

In the graphite layer, the thermal conductivity in a direction substantially perpendicular to the lamination direction of the laminate is preferably approximately 250 to approximately 2,000 W/m·K, and further preferably approximately 500 to approximately 2,000 W/m·K. When the thermal conductivity of the graphite layer is in the range described above, the heat-dissipating section and the heat sink each having excellent heat-dissipation performance and thermal uniformity can be obtained.

The thermal conductivity of the graphite layer in the direction substantially perpendicular to the lamination direction of the laminate can be measured by measuring thermal diffusivity, specific heat capacity and density by using a laser flash or xenon flash thermal diffusivity measuring apparatus, differential scanning calorimetry (DSC) and an Archimedes method, and multiplying values thereof.

A thickness of the graphite layer is not particularly restricted, and in order to obtain the heat-dissipating section and the heat sink each having excellent heat-dissipation characteristics, the thickness is preferably a thick layer, further preferably approximately 15 to approximately 600 micrometers, still further preferably approximately 15 to approximately 500 micrometers, and particularly preferably approximately 20 to approximately 300 micrometers.

4. Resin Layer

The heat-dissipating section and the heat sink may have a resin layer on either one or both of outermost layers of the laminate in order to improve the heat-dissipation performance, anti-oxidation or a design.

The resin layer is not particularly restricted as long as the resin layer contains a resin, and specific examples include an acrylate resin, an epoxy resin, an alkyd resin, a urethane resin, polyimide and nitrocellulose, each being widely used as a coating material, and above all, a heat-resistant resin is desired.

Specific examples of a commercially available product of the coating material containing the resin include a heat-resistant coating material (heat-resistant coating material One Touch, made by Okitsumo Incorporated).

The resin layer may contain the thermally conductive filler or a filler having high far-infrared emissivity in order to provide the laminate with heat-dissipating ability from a surface of the laminate by radiation with far infrared rays.

The filler having high far-infrared emissivity is not particularly restricted, but preferably include at least one kind of filler selected from the group of a mineral such as cordierite and mullite; nitride such as boron nitride and aluminum nitride; oxide such as silica, alumina, zinc oxide, and magnesium oxide; silicon carbide; and graphite, for example.

A kind of resin used for the resin layer only needs to be appropriately selected according to temperature at which the heat sink is used, a method of forming the resin layer and temperature therefor.

Moreover, as the kind of filler used for the resin layer, a filler having high thermal conductivity and/or a filler having high far-infrared emissivity only needs to be appropriately selected according to an application in which the heat sink is used.

The resin layer may be directly formed on the metal layer or the graphite layer, or may be formed on the metal layer or the graphite layer through the adhesive layer (A).

In addition, when the heat-dissipating section is brought into contact with the base section through a conventionally known layer, or the heat sink 2 is brought into contact with the electronic circuit board or the heating unit through a conventionally known layer, a thermally conductive grease or a thermally conductive double-sided adhesive tape is necessary to be attached onto the contact portion, and therefore non-existence of the resin layer on the contact portion is preferred.

5. Method of Manufacturing Laminate

The laminate can be prepared by applying the composition for adhesive layer formation onto the metal sheet on which the metal layer is formed or the graphite sheet on which the graphite layer is formed, and preliminarily drying the applied material when necessary, and then arranging the metal sheet and the graphite sheet so as to interpose the composition, and then heating the resulting material while applying pressure. Moreover, upon manufacturing the laminate, the composition for adhesive layer formation is preferably applied onto both the metal sheet and the graphite sheet in view of obtaining the heat-dissipating section and the heat sink each having high bond strength between the metal layer and the graphite layer, and so forth.

Before applying the composition for adhesive layer formation thereonto, in view of obtaining the heat-dissipating section and the heat sink each having high bond strength between the metal layer and the graphite layer, and so forth, with regard to the metal layer, an oxide layer on the surface thereof is preferably removed or the surface thereof is preferably degreased and cleaned, and with regard to the graphite layer, the surface thereof is preferably subjected to easy-adhesion treatment using an oxygen plasma apparatus, strong acid treatment or the like.

A method of applying the composition for adhesive layer formation onto the metal sheet or the graphite sheet is not particularly restricted, but a wet coating method by which the composition can be uniformly applied thereonto is preferably applied. Among the wet coating methods, when adhesive layer (A) having a small film thickness is formed, a spin coating method that is simple and formable of a homogeneous film is preferably applied. When productivity is emphasized, such a method is preferred as a gravure coating method, a die coating method, a bar coating method, a reverse coating method, a roll coating method, a slit coating method, a spray coating method, a kiss coating method, a reverse kiss coating method, an air knife coating method, a curtain coating method and a rod coating method.

The preliminary drying is not particularly restricted, and may be performed by leaving the composition to stand at room temperature for approximately 1 to 7 days, but heating is preferably performed at approximately 80 to 120° C. for approximately 1 to 10 minutes on a hot plate, in a drying oven or the like.

Moreover, the preliminary drying only needs to be performed in air, but if desired, may be performed under an atmosphere of an inert gas such as nitrogen and rare gas or under reduced pressure. In particular, when the composition is dried in a short time at a high temperature, drying is preferably performed under the atmosphere of the inert gas.

A method of heating the composition while applying pressure is not particularly restricted, but the pressure is preferably approximately 0.1 to approximately 30 MPa, heating temperature is preferably approximately 200 to approximately 250° C., and heating and pressurizing time is approximately 1 minute to approximately 1 hour. Moreover, the heating only needs to be performed in air, but if desired, may be performed under an atmosphere of an inert gas such as nitrogen and rare gas or under reduced pressure. In particular, when the composition is heated in a short time at a high temperature, heating is preferably performed under the atmosphere of the inert gas or under reduced pressure.

The laminate having the resin layer in either one or both of the outermost layers may be manufactured by applying a coating material containing the resin onto either one or both of the metal layer and the graphite layer, each being the outermost layer of the laminate, and when necessary, drying the coated material and then curing the coating material. Moreover, the laminate can also be manufactured by preliminarily forming a film made of resin, applying the composition for adhesive layer formation or a conventionally known adhesive onto either one or both of the metal layer and the graphite layer, each being the outermost layer of the laminate, and when necessary preliminary drying the applied material, and then bringing the film made of resin into contact with the applied surface, and when necessary applying pressure onto the film or heating the film or the like.

It will be apparent to those skilled in the art that various modifications and variations can be made in the invention and specific examples provided herein without departing from the spirit or scope of the invention. Thus, it is intended that the invention covers the modifications and variations of this invention that come within the scope of any claims and their equivalents.

The following examples are for illustrative purposes only and are not intended, nor should they be interpreted to, limit the scope of the invention.

EXAMPLES

The invention is described in greater detail by way of Examples below. However, the invention is not limited to the content described in Examples below.

Materials used in Examples of the invention are as described below.

Graphite Sheet

Graphite sheet (artificial graphite): SS-1500 (trade name) made by GrafTECH International Holding Inc., thickness: 25 μm, (thermal conductivity of the sheet in the plane direction: 1,500 W/m·K).

Graphite sheet (natural graphite): SS-500 (trade name), made by GrafTECH International Holding Inc., thickness: 76 μm, (thermal conductivity of the sheet in the plane direction: 500 W/m·K).

Metal Sheet

Copper sheet: made by The Nilaco Corporation, thickness: 0.05 mm.

Electrolytic copper foil: Furukawa Electric Co., Ltd., 0.012 mm.

Aluminum sheet: made by The Nilaco Corporation, thickness: 0.125 mm.

Aluminum sheet: made by The Nilaco Corporation, thickness: 0.10 mm.

Hard aluminum foil: made by Sumikei Aluminum Foil Co., Ltd., thickness: 0.020 mm.

Magnesium alloy (AZ31) sheet: made by Osaka Fuji Corporation, thickness: 1.2 mm.

Polyvinyl Acetal Resin

"PVF-K": polyvinyl formal resin, Vinylec K (trade name), made by JNC Corporation.

A structure and so forth of the "PVF-K" are described in Table 1 below.

TABLE 1

| | Molecular weight [—] | Constitutional unit A [mol %] | Constitutional unit B [mol %] | Constitutional unit C [mol %] | Constitutional unit D [mol %] |
|---|---|---|---|---|---|
| PVF-K | 45,000 | 75.7 | 11.5 | 12.9 | — |

Pressure-Sensitive Adhesive Double Coated Tape

TR-5310F, made by Nitto Denko Corporation, thickness: 0.100 mm.

NeoFix10, made by Nichiei Kako Co., Ltd., thickness: 0.010 mm.

Example 1

Preparation of Heat Sink

In a 200 mL three-necked flask, 80 g of cyclopentanone was put, a stirring blade made of fluorocarbon resin was set from above, and the stirring blade was rotated by a motor. A speed of revolution was timely adjusted according to viscosity of a solution. In the flask, 10 g of polyvinyl formal resin (PVF-K) was put using a glass funnel. PVF-K attached onto the funnel was washed with 20 g of cyclopentanone, and then the funnel was removed and a glass stopper was placed thereon. The obtained solution was heated in a water bath set at 80° C. for 4 hours while the solution was stirred to completely dissolve PVF-K in cyclopentanone. The flask after stirring was removed from the water bath to obtain a composition for forming an adhesive layer.

The composition for adhesive layer formation was applied onto electrolytic copper foil having a size of 300 mm×50 mm and a thickness of 0.012 mm to be 2 μm in a thickness of an adhesive coating film to be obtained, at 1,500 revolutions per minute, by using a spin coater (1H-D3 model; made by MIKASA Co., Ltd.), and then the resulting material was preliminarily dried for 3 minutes at 80° C. on a hot plate set at 80° C. to obtain copper foil with an adhesive coating film.

An artificial graphite sheet having a size of 300 mm×50 mm and a thickness of 0.025 mm was interposed between two sheets of copper foil with the adhesive coating film, with the adhesive coating film facing inward, and the resulting material was left to stand on a hot plate of a compact heating press (IMC-19EC type small heating hand press; made by Imoto Machinery Co., Ltd.). The adhesive coating film was deaerated by repeating pressurization and decompression several times while attention was paid so as to avoid slip of two sheets of copper foil and the graphite sheet, and then pressurized up to 6 MPa. Then, the hot plate was heated to 240° C. by using a heater, and temperature and pressure were held for 5 minutes. After elapse of 5 minutes, power supply to the heater was turned off while the pressure was held, and the film was naturally cooled to approximately 50° C. After cooling, the pressure was released to obtain a laminate. In addition, ½ of a value obtained by subtracting a thickness of the two sheets of metal foil and a thickness of the graphite sheet from a whole thickness of the laminate was taken as a thickness of the adhesive layer. A thickness of the laminate was measured by using Digimicro MF-501+ Counter TC-101, made by Nikon Corporation.

Figure 5:
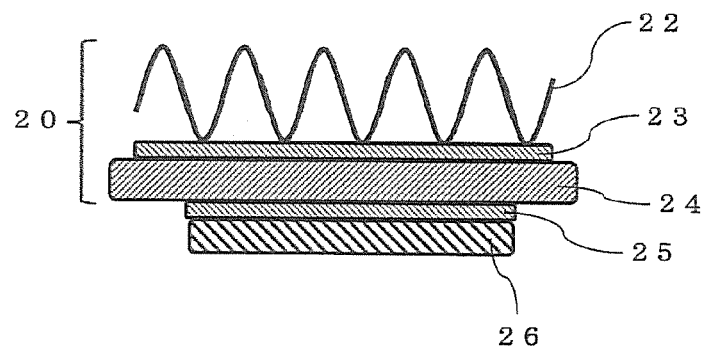
FIG. 5 is a cross-sectional schematic view showing one example of heat sink 1.
Figure 6:
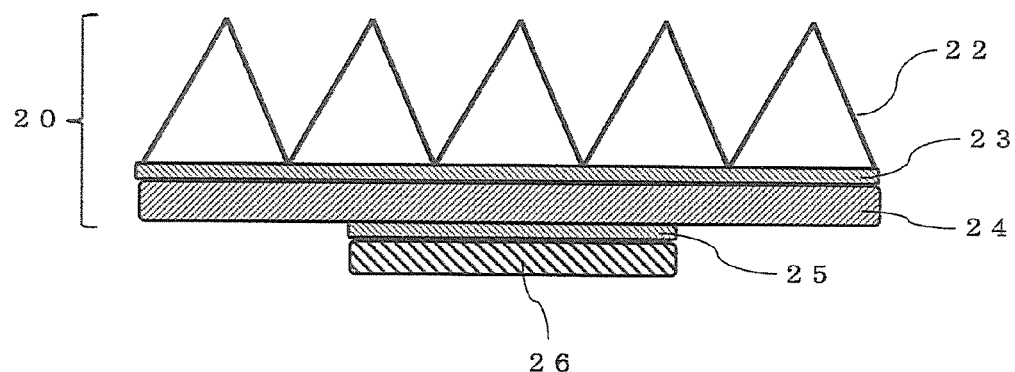
FIG. 6 is a cross-sectional schematic view showing one example of heat sink 1.
Figure 7:
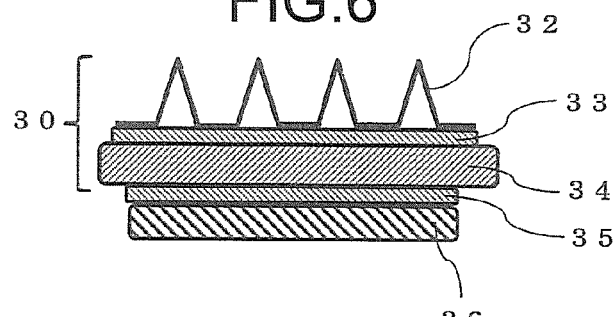
FIG. 7 is a cross-sectional schematic view showing one example of heat sink 1.
Figure 8:
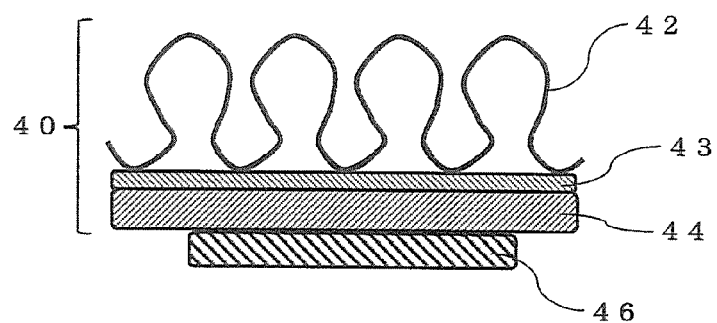
FIG. 8 is a cross-sectional schematic view showing one example of heat sink 1.

From the obtained laminate, two laminates having a size of 250 mm×50 mm and a size of 50 mm×50 mm were cut out by using a shear cutter. The laminate having the size of 250 mm×50 mm was bent in such a manner that a site to be desirably bent was wound around a copper pipe having a diameter of 5 mm to be approximately 50 mm in length to prepare a bellows-like heat-dissipating section. Subsequently, a double-sided adhesive tape (NeoFix10) was pasted onto one side of the laminate (base section) having the size of 50 mm×50 mm, and the heat-dissipating section was pasted thereonto as shown in FIG. 5 to obtain a heat sink. A weight of the heat sink obtained is shown in Table 2.

Evaluation of Heat-Dissipation Characteristics

In a center of a plane of the base section on a side on which no heat-dissipating section in the heat sink obtained in Example 1 was stuck, a thermally conductive double-sided tape (TR-5310F) having a size of 10 mm×10 mm was stuck, and a T0220 package transistor (2SD2013; made by Toshiba Corporation) was bonded onto a part on which the double-sided tape was stuck. A K thermocouple (ST-50, made by RKC Instrument Inc.) is attached on a rear plane on a plane of the transistor bonded with the heat sink, a temperature of the transistor on a plane on a side opposite to the plane on which the heat sink was bonded can be recorded by using a temperature data logger (GL220, made by Graphtec Corporation). The transistor on which the thermocouple was attached was left to stand in a center of a constant temperature bath set at 40° C., the temperature of the transistor was confirmed to become constant at 40° C., and then 1.5 V was applied to the transistor by using a stabilized direct current power supply, and a temperature change on a surface was measured. On the above occasion, electric current passing through the transistor showed approximately 1.5 A. The transistor generates a predetermined amount of heat if same wattage is applied, and therefore the temperature decreases as a heat-dissipating effect of the heat sink attached thereon is higher. More specifically, the heat sink when the temperature of the transistor decreases can be reasonably referred to have a higher heat-dissipating effect.

The temperature of the transistor after 1800 seconds from applying voltage was measured.

Example 2

A heat sink was prepared, and heat-dissipation characteristics were evaluated in a manner similar to the method in Example 1 except that the copper pipe having the diameter of 5 mm was changed to a 5 mm-square copper square material, and a bending part was formed into a U shape as shown in FIG. 4.

Comparative Examples 1 and 2

Heat sinks were prepared in a manner similar to the method in Examples 1 and 2 except that a copper sheet having a thickness of 0.05 mm was used in place of the laminate, and taken as Comparative Examples 1 and 2, respectively. Heat-dissipation characteristics with regard to Comparative Examples 1 and 2 were evaluated by a method same with the method in Example 1.

Table 2 shows weight and the temperatures of the transistors after 1800 seconds from applying voltage in Examples 1 and 2 and Comparative Examples 1 and 2.

TABLE 2

| | Temperature of transistor after 1800 seconds (° C.) | Weight (g) |
|---|---|---|
| Example 1 | 71.8 | 5.3 |
| Example 2 | 67.7 | 4.1 |
| Comparative Example 1 | 76.1 | 7.8 |
| Comparative Example 2 | 78.8 | 6.6 |

In comparison between Example 1 and Comparative Example 1, while the heat sink in Example 1 is lighter, by 2.5 g, than the heat sink in Comparative Example 1, the temperature of the transistor is reduced by 4.3° C. Moreover, in comparison between Example 2 and Comparative Example 2, while the heat sink in Example 2 is lighter, by 2.5 g, than the heat sink in Comparative Example 2, the temperature of the transistor is reduced by 11.1° C.

In comparison between Example 1 and Example 2, the heat-dissipating section and the base section are in contact only in a line in the heat sink of Example 1. However, in the heat sink in Example 2, approximately 10% of the surface area on a side of the heat-dissipating section in contact with the base section is in contact with the base section, and therefore heat from the base section is effectively conducted to the heat-dissipating section, and the heat-dissipating effect is considered to be higher in the case where the heat sink in Example 2 is used. Actually, when the double-sided tape was observed by peeling the heat-dissipating section from the base section of the heat sink in Example 1 after the measurement, both sections were contacted only in approximately 2% of the surface area of the heat-dissipating section. Moreover, in comparison between Comparative Example 1 and Comparative Example 2, the temperature resulted in a higher level in Comparative Example 2 in which a contact area between the heat-dissipating section and the base section is wider, which is considered to be caused because no sufficient adhesion between the heat-dissipating section and the base section can be achieved with the 10 μm-thick pressure sensitive adhesive tape by stickiness of copper. In contrast, followability of the heat-dissipating section to the base section is shown to be higher in the heat sink of the invention described in Example 2, namely a capability of assembly is shown with sufficient adhesion even with a thin double-sided tape. In addition, an attempt was made on preparing the heat-dissipating section only with a same 0.050 mm-thick artificial graphite sheet, but the shape thereof was unable to be kept, and the heatsink was unable to be prepared.

Examples 3 and 4 and Comparative Examples 3 and 4

On an outermost layer on a side opposite to a side of the heat-dissipating section in contact with the base section of the heat sink each obtained in Examples 1 and 2 and Comparative Examples 1 and 2, a heat-resistant coating material (heat-resistant coating material One Touch; made by Okitsumo Incorporated) was subjected to spray coating, respectively, and the resulting material was dried to be approximately 20 μm in a thickness of coating film. The resulting materials are taken as Examples 3 and 4 and Comparative Examples 3 and 4, respectively. Heat-dissipation characteristics were evaluated under conditions same with the conditions in Example 1 by using the thus obtained heat sinks, respectively. Table 3 shows the results.

TABLE 3

|  | Temperature of transistor after 1800 seconds (° C.) |
|---|---|
| Example 3 | 66.7 |
| Example 4 | 61.6 |
| Comparative Example 3 | 72.5 |
| Comparative Example 4 | 72.8 |

As is obvious in comparison between the results in Tables and 3, the temperature decrease by approximately 6° C. is recognized by coating a metal surface and reducing infrared reflectance on the metal surface, and the heat sink having further sufficient heat-dissipation efficiency is found to be obtainable.

Example 5

A laminate was prepared in a manner similar to Example 2 except that aluminum foil having a size of 100 mm×30 mm and a thickness of 0.02 mm and a natural graphite sheet having a size of 100 mm×30 mm and a thickness of 0.076 mm were used in place of the copper foil and the artificial graphite sheet in Example 2, and a heat-dissipating section was prepared by bending the laminate into a bellows shape to be approximately 30 mm in length in a manner similar to Example 2. A heat sink was prepared by sticking the heat-dissipating section on a magnesium sheet having a dimension of 30 mm×30 mm×1.2 mm by using a pressure sensitive adhesive tape (NeoFix10), and heat-dissipation characteristics were evaluated in a manner similar to Example 2.

Comparative Example 5

A heatsink was prepared and heat-dissipation characteristics were evaluated in a manner similar to Example 5 except that a 0.125 mm-thick aluminum sheet was used in place of the laminate in Example 5. Table 4 shows the evaluation results in Example 5 and Comparative Example 5.

TABLE 4

|  | Temperature of transistor after 1800 seconds (° C.) |
|---|---|
| Example 5 | 69.5 |
| Comparative Example 5 | 73.7 |

In comparison between Example 5 and Comparative Example 5, even when the base section is not the laminate, the heat sink having better heat-dissipation characteristics is found to be obtained, in comparison with the case where the laminate has no graphite layer, by preparing the heat-dissipating section using the laminate.

Example 6

Figure 14:
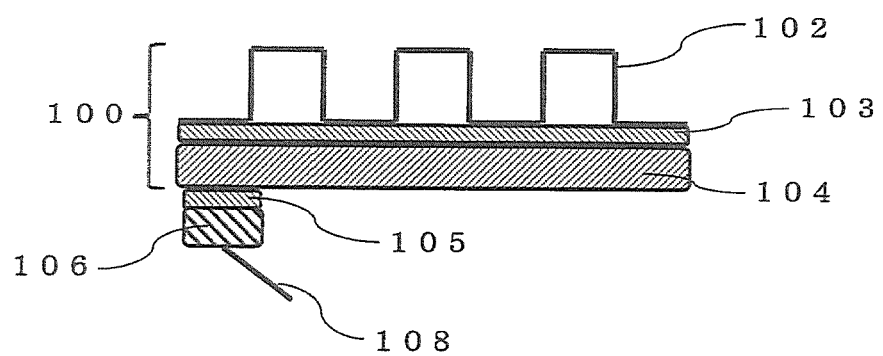
FIG. 14 is a cross-sectional schematic view showing a state (arrangement of each member) upon evaluating heat-dissipating characteristics in Example 6.

A transistor (size: 10 mm×17 mm) on which a thermocouple 108 was attached was stuck onto the heat sink obtained in Example 4 by using a thermally conductive double-sided tape 105 (TR-5310F) cut into a size of 10 mm×10 mm, as shown in FIG. 14. The sample was left to stand in a natural convection type constant temperature bath set at 40° C. in such a manner that the heat-dissipating section thereof was directed upward (as shown in FIG. 14), a voltage of 1.3 V was applied to the transistor, and a temperature of the transistor after 1800 seconds from applying voltage was recorded. In addition, electric current passing through the transistor was approximately 1.45 A at the above occasion. In FIG. 14,
100 is the heat sink obtained in Example 4,
102 is the material in which a heat-resistant coating material is coated onto an outermost
portion of heat-dissipating section prepared in Example 2,
103 is the double-sided tape,
104 is the base section prepared in Example 1 and
106 is the heating unit (transistor).

Reference Example 6

Figure 15:
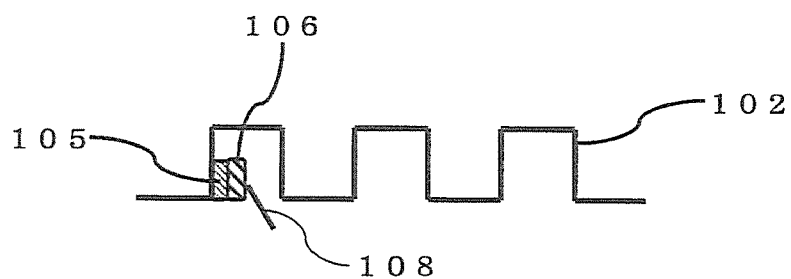
FIG. 15 is a cross-sectional schematic view showing a state (arrangement of each member) upon evaluating heat-dissipating characteristics in Reference Example 6.

A material 102 was prepared by using only the heat-dissipating section obtained in Example 2, and coating one side thereof with a heat-resistant coating material in a manner similar to Example 3. A transistor 106 (size: 10 mm×17 mm) attached with a thermocouple 108 was stuck onto a side opposite to the plane on which the heat-resistant coating material was coated, by using a thermally conductive double-sided tape 105 (TR-5310F) cut into a size of 10 mm×10 mm, as shown in FIG. 15. The sample was left to stand in a natural convection type constant temperature bath set at 40° C., as shown in FIG. 15, a voltage of 1.3 V was applied to the transistor, and a temperature of the transistor after 1800 seconds from applying voltage was recorded.

While the temperature of the transistor was 68.7° C. in Example 6, the temperature was raised to 95.3° C. in Reference Example 6. Accordingly, effective heat dissipation is considered to be attainable, when a heating unit is smaller than the heat sink, by once diffusing heat in a lateral direction (direction substantially perpendicular to directions of peaks and troughs forming bellows of the heat-dissipating section) by the base section, and then transferring the heat to the heat-dissipating section.

Example 7

Figure 16:
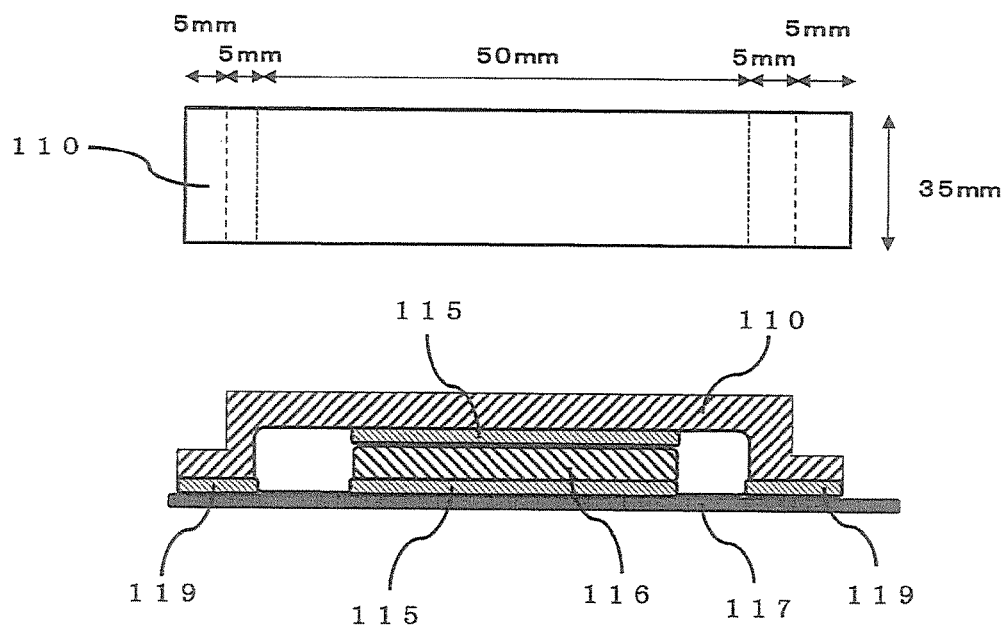
FIG. 16 is a cross-sectional schematic view showing a state (arrangement of each member) upon evaluating heat-dissipating characteristics in Example 7.

A laminate was formed in a manner similar to Example 1, and then cut into a size of 35 mm×70 mm. A sample was obtained by bending the thus obtained laminate as shown in FIG. 16 (heat sink 110 in FIG. 16), and then fixing a transistor attached in a center of a universal board (ICB-288GU made by Sunhayato Corporation) by using a thermally conductive double-sided tape 115 (TR-5310F) and an electrically conductive double-sided tape 119 (made by Okenshoji Co. Ltd.) as shown in FIG. 16. The thus obtained sample was left to stand in a natural convection type constant temperature bath set at 40° C., an internal temperature became constant at 40° C., and then a voltage of 1.2 V was applied to the transistor, and a temperature of the transistor after 1800 seconds from applying voltage was recorded. In FIG. 16,
110 is a heat sink obtained in Example 7,
116 is a heating unit (transistor) and
117 is an electronic circuit board (universal board).

Comparative Example 7

A sample was obtained in a manner similar to Example 7 except that a 0.1 mm-thick aluminum sheet was used in place of the laminate in Example 7. Heat-dissipation characteristics were evaluated by using the thus obtained sample in a manner similar to Example 7.

While the temperature of the transistor was 66.9° C. after 1800 seconds in Example 7, the temperature was raised to 72.1° C. in Comparative Example 7. Accordingly, a temperature of a heating unit such as the transistor on an electronic circuit board or a semiconductor component is found to be effectively reducible by using heatsink 2 of the invention. Moreover, the universal board made of glass epoxy on which one layer of copper foil was laminated was used as a base material of the electronic circuit board in Example 7. However, when a multilayer printed circuit board in which a proportion of copper is higher is used, an effect of using the heat sink of the invention became further significant. In other words, when the multilayer printed board in which the proportion of copper content is higher is used in place of the universal board in Example 7 and Comparative Example 7, the temperature of the transistor in Examples was significantly reduced in comparison with Comparative Examples. Moreover, the temperature of the transistor is considered to be reducible by coating the heat-resistant coating material or the like to a plane on a side opposite to a side in contact with the heating unit of the heat sink as in Example 3 in Example 7.

Reference Example 8

A plane heat sink was obtained by forming a laminate (thickness: 49 μm) in a manner similar to Example 1, and then cutting the laminate into a size of 50 mm×50 mm, applying a heat-resistant coating material (heat-resistant coating material: One Touch made by Okitsumo Incorporated) onto an upper plane of the laminate to be 30 μm in thickness. Heat-dissipation characteristics were evaluated in a manner similar to "evaluation of heat-dissipation characteristics" in Example 1 except that the obtained heat sink was used, a transistor was bonded in a center of a plane on a side opposite to a plane on which the heat-resistant coating material was applied in the heat sink, and voltage applied to the transistor was changed to 1.0 V.

Comparative Example 8

Copper foil with a pressure sensitive adhesive tape was obtained by sticking NeoFix10 onto two sheets of electrolytic copper foil cut into a size of 40 mm×40 mm and having a thickness of 0.012 mm. Subsequently, a laminate for comparison (thickness: 69 μm) was prepared by interposing an artificial graphite sheet cut into a size of 40 mm×40 mm and having a thickness of 0.025 mm using the two sheets of copper foil with the pressure sensitive adhesive tape, with the pressure sensitive adhesive tape facing inward, while attention was paid on avoiding entry of air thereto. A heat sink was prepared in a manner similar to Reference Example 8 except that the laminate for comparison was used, and heat-dissipation characteristics were evaluated in a manner similar to Reference Example 8.

The temperature of the transistor in Reference Example 8 was 67.6° C., and the temperature of the transistor in Comparative Example 8 was 68.2° C. A difference in the temperature is 0.6° C. and the difference is far from large. However, a total of thickness of an adhesive layer in each heat sink is smaller by 20 μm in Reference Example 8. Therefore, the heat sink having high heat-dissipation performance is found to be obtainable by using the adhesive layer formed using a composition containing a polyvinyl acetal resin, even if the thickness of the laminate is smaller by 29%.

Although the invention has been described and illustrated with a certain degree of particularity, it is understood that the disclosure has been made only by way of example, and that numerous changes in the conditions and order of steps can be resorted to by those skilled in the art without departing from the spirit and scope of the invention.

What is claimed is:
1. A heat sink, comprising a base section in contact with a heating unit, and a heat-dissipating section for dissipating heat received from a heating unit by the base section, wherein
the base section includes at least one metal layer, and
the heat-dissipating section includes a laminate prepared by laminating a metal layer and a graphite layer through an adhesive layer formed by using a composition containing a polyvinyl acetal resin.
2. The heat sink according to claim 1, wherein the heat-dissipating section is bellows-like.
3. A heat sink for dissipating heat from a heating unit, wherein the heat sink includes a laminate prepared by laminating a metal layer and a graphite layer through an adhesive layer formed by using a composition containing a polyvinyl acetal resin, and is arranged so as to cover the heating unit.

4. The heat sink according to claim 1, wherein the polyvinyl acetal resin comprises the following constitutional units A, B and C:

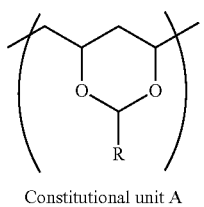

Formula 1

Constitutional unit A wherein, in constitutional unit A, R is independently hydrogen or alkyl;

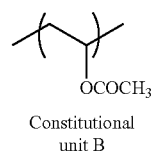

Formula 2

Constitutional unit B

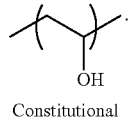

Formula 3

Constitutional unit C

5. The heat sink according to claim 4, wherein the polyvinyl acetal resin further comprises the following constitutional unit D:

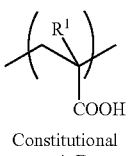

Formula 4

Constitutional unit D wherein, in constitutional unit D, R¹ is independently hydrogen or alkyl having 1 to 5 carbons.

6. The heat sink according to claim 1, wherein a thickness of the adhesive layer is 30 micrometers or less.

7. The heat sink according to claim 3, wherein the polyvinyl acetal resin comprises the following constitutional units A, B and C:

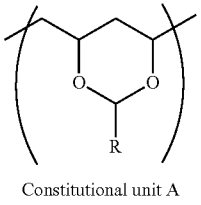

Formula 1

Constitutional unit A wherein, in constitutional unit A, R is independently hydrogen or alkyl;

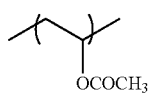

Formula 2

Constitutional unit B

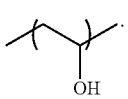

Formula 3

Constitutional unit C

8. The heat sink according to claim 7, wherein the polyvinyl acetal resin further comprises the following constitutional unit D:

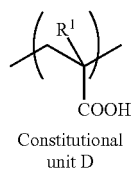

Formula 4

Constitutional unit D wherein, in constitutional unit D, R¹ is independently hydrogen or alkyl having 1 to 5 carbons.

9. The heat sink according to claim 3, wherein a thickness of the adhesive layer is 30 micrometers or less.

* * * * *